United States Patent
Uchiyama et al.

(10) Patent No.: US 7,301,409 B2
(45) Date of Patent: Nov. 27, 2007

(54) OSCILLATOR

(75) Inventors: Hisayoshi Uchiyama, Ora-gun (JP); Futoshi Wakai, Isesaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 66 days.

(21) Appl. No.: 11/346,149

(22) Filed: Feb. 3, 2006

(65) Prior Publication Data

US 2006/0176118 A1   Aug. 10, 2006

(30) Foreign Application Priority Data

Feb. 7, 2005   (JP) ............... 2005-030998

(51) Int. Cl.
*H03L 7/00* (2006.01)
(52) U.S. Cl. .............. 331/57; 331/15; 331/16
(58) Field of Classification Search .......... 331/57, 331/15, 16
See application file for complete search history.

(56) References Cited

U.S. PATENT DOCUMENTS 5,392,003 A * 2/1995 Nag et al. ................. 330/254

2001/0015677 A1 * 8/2001 Choi ........................... 331/11

* cited by examiner

*Primary Examiner*—Joseph Chang
(74) *Attorney, Agent, or Firm*—Oliff & Berridge, PLC

(57) ABSTRACT

In the current-controlled oscillator performing an oscillation frequency control by using a differential amplifier circuit, resistors are inserted to each current path of a differential pair of the differential amplifier circuit, and thereby an inclination of output currents Ia, Ib of a differential pair is small in the linear line region. Further, by setting a reference voltage applied to a base of a transistor of one side of the differential pair lowly, the linear region is shifted to low voltage side, and thereby a saturation region of the low voltage side is not occurred. Moreover, when a comparison result of a phase of an output signal of the current-controlled oscillation circuit and a reference signal is converted to an oscillation frequency control voltage $V_{tune}$, by limiting an upper limit voltage of the $V_{tune}$ by an output of a regulator in stead of a positive voltage power source $V_{cc}$ of common circuit, the $V_{tune}$ does not move to a saturation region upper than the linear region. According to the current-controlled oscillator, it is possible to prevent deterioration of a phase noise characteristic or deadlock caused by an inclination or a width of the linear region of the output characteristic of the differential amplifier circuit.

5 Claims, 6 Drawing Sheets

(related art)

OSCILLATOR

CROSS-REFERENCE TO RELATED APPLICATIONS

The priority application number JP2005-030998 upon which this patent application is based is hereby incorporated by reference.

BACKGROUND OF THE INVENTION

1. Field of the Invention

The present invention relates to an oscillator generating an electrical oscillation signal and more particularly, to an oscillator capable of operating stably.

2. Description of the Related Art

FIG. 1 is a block diagram showing a conventional oscillator. The oscillator is constituted by a current-controlled oscillation circuit 2, a phase-locked loop circuit (PLL) 4, a reference signal source 6, a low pass filter (LPF) 8 and an oscillation frequency control circuit 10.

The current-controlled oscillation circuit 2 is a differential ring oscillator having interpolating delay circuits interconnected in multi-stage in which the transfer time of a signal from an input terminal to an output terminal is variably controlled in response to a current outputted from the oscillation frequency control circuit 10.

The PLL 4 generates and outputs an oscillation frequency control voltage $V_{tune}$ in response to a phase difference between an output oscillation signal $V_{out}$ from the current-controlled oscillation circuit 2 and a reference signal from the reference signal source 6.

FIG. 2 is a circuit diagram schematically showing a conventional PLL 4. The PLL 4 is constituted by a phase comparator 12, a switch control circuit 14 and field effect transistors (FETs) 16, 18. The phase comparator 12 is inputted the output oscillation signal $V_{out}$ and the reference signal S and then detects the phase difference between these signals. The switch control circuit 14 receives a comparison result signal from the phase comparator 12 and generates switch control signals which selectively turn on FETs 16, 18. The FET 16 is a FET of P channel connected between a power source of positive voltage $V_{cc}$ and an output terminal of $V_{tune}$, and a switch control signal CP is applied to a gate thereof from the switch control circuit 14. Meanwhile, the FET 18 is a FET of N channel connected between a ground potential GND and an output terminal of $V_{tune}$, and the switch control signal CN is applied to a gate thereof from the switch control circuit 14. For example, in a period in which $V_{out}$ is followed by the reference signal S in phase, CP becomes low (L) level and FET 16 becomes ON state. Accordingly, $V_{tune}$ is increased. Meanwhile, in a period in which $V_{out}$ is preceded by the reference signal S in phase, CN becomes high (H) level and FET 18 becomes ON state. Accordingly, $V_{tune}$ is decreased.

FIG. 3 is a circuit diagram showing a conventional oscillation frequency control circuit 10. The oscillation frequency control circuit 10 is a differential amplifier circuit, and a current path consisting of channels of transistors Q1 and Q2 which are interconnected serially and a current path consisting of channels of transistors Q3 and Q4 which are interconnected serially are connected to a common constant current source I0. A base of Q1 is connected to a reference voltage $V_c$, and $V_{tune}$ is applied to a base of Q3. The ratio of current Ib flowing through Q2 and current Ia flowing through Q4 out of currents supplied from the constant current source I0 is changed in response to the difference of $V_{tune}$ and $V_c$ which are differential input signals. $V_c$ is set to a voltage corresponding to $V_{cc}/2$ which is intermediate voltage between $V_{cc}$ and GND.

The current Ib flowing to Q2 and current Ia flowing to Q4 are supplied to the interpolating delay circuit constituting the current-controlled oscillation circuit 2 by using a current mirror circuit, respectively. For example, the current Ib becomes a current source of a differential amplifier circuit of low speed path of the interpolating delay circuit, and meanwhile, the current Ia becomes a current source of a differential amplifier circuit of high speed path of the interpolating delay circuit. As $V_{tune}$ is decreased and Ia is increased, in the interpolating delay circuit, a signal transfer by the high speed path out of low speed path and high speed path parallelly connected becomes dominant, the time of the signal transfer is decreased, and thereby phase delay of $V_{out}$ can be eliminated. Meanwhile, as $V_{tune}$ is increased and Ib is increased, a signal transfer by the low speed path becomes dominant, the time of the signal transfer is increased, and thereby phase lead of $V_{out}$ can be eliminated.

FIG. 4 is a graph showing the variation of the Ia and Ib of a conventional oscillation frequency control circuit 10 with respect to $V_{tune}$. A region in which Ia and Ib are not changed with respect to the variation of $V_{tune}$ is referred to as a saturation region. Meanwhile, a region in which Ia and Ib are changed with respect to the variation of $V_{tune}$ is referred to as a linear region. In the conventional oscillation frequency control circuit, the linear region is a relatively small range such as 0.1 V or less with a center on $V_c$, and an oscillation frequency of the current-controlled oscillation circuit 2 is changed in this linear region. However, the oscillation frequency is not changed in the saturation region other than the small linear region. By this characteristic, in one case, since the change of an oscillation frequency in accordance with the variation of $V_{tune}$ in the linear region is steep, although $V_{tune}$ is changed slightly by noise, the oscillation frequency is changed largely. That is, there has been a problem that a phase noise characteristic of the PLL is deteriorated. Also, in the other case, if $V_{tune}$ is changed up to a saturation region, Ia and Ib become constant and thereby the oscillation frequency becomes to be not changed. That is, there has been a problem that the PLL becomes inability to control frequency (deadlock state).

SUMMARY OF THE INVENTION

An object of the present invention is to provide an oscillator using a current-controlled oscillation circuit by avoiding a deterioration of a phase noise characteristic or a deadlock state and with which a stable oscillating operation is realized.

An oscillator according to a first aspect of the invention includes a differential amplifier circuit that is applied an oscillation frequency control voltage and a reference voltage to a pair of input terminals provided corresponding to two current paths connected to the common current source and takes out a pair of current as a differential output current from a current flowing through each of the current paths. The oscillator controls an oscillation frequency of the output oscillation signal based on the differential output current. Resistor elements are serially connected to each of the current paths of the differential amplifier circuit. These resistor elements enlarge a voltage range of a linear region of the differential output current.

An oscillator according to a second aspect of the invention includes: a phase-locked loop circuit that generates an oscillation frequency control voltage based on a phase difference between an output oscillation signal and a reference signal; and a differential amplifier circuit that is applied the oscillation frequency control voltage and a reference voltage to a pair of input terminals provided corresponding to two current paths connected to a common current source and takes out a pair of currents flowing through each of the current paths as a differential output current. The oscillator controls an oscillation frequency of the output oscillation signal based on the differential output current. The phase-locked loop circuit includes a phase comparator that detects the phase difference; a first switch element that is connected between a output terminal of the oscillation frequency control voltage and a first common power source; a second switch element that is connected between the output terminal and a second common power source; a regulator that is provided between the first common power source and the first switch element and thereby generates a predetermined limit voltage based on the first common power source; and a switch control circuit that selectively turns on the first switch element and the second switch element in response to the phase difference. The limit voltage is set in response to a voltage near the first common power source out of upper limit voltage and lower limit voltage of a linear region of the differential output current with respect to the variation of the oscillation frequency control voltage.

This setting of the limit voltage limits the variation range of the oscillation frequency control voltage, and thereby prevents the oscillation frequency control voltage from entering a saturation region.

DESCRIPTION OF THE PREFERRED EMBODIMENTS

Hereinafter, embodiments of the invention (hereinafter, referred to as embodiment) will be described with reference to the accompanying drawings, wherein like numbers reference like elements.

Figure 1:
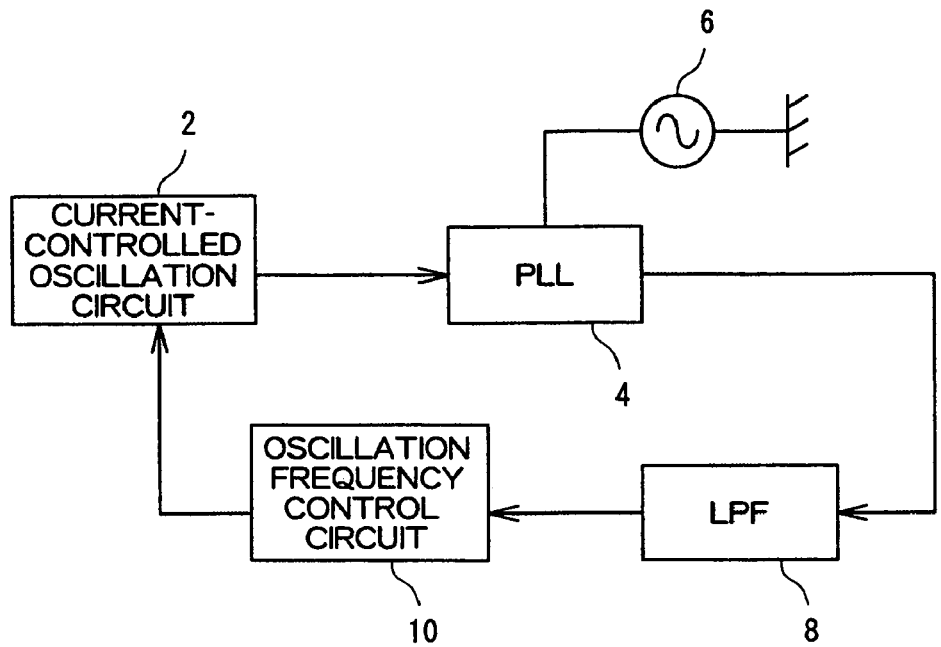
FIG. 1 is a block diagram showing a conventional oscillator.
Figure 2:
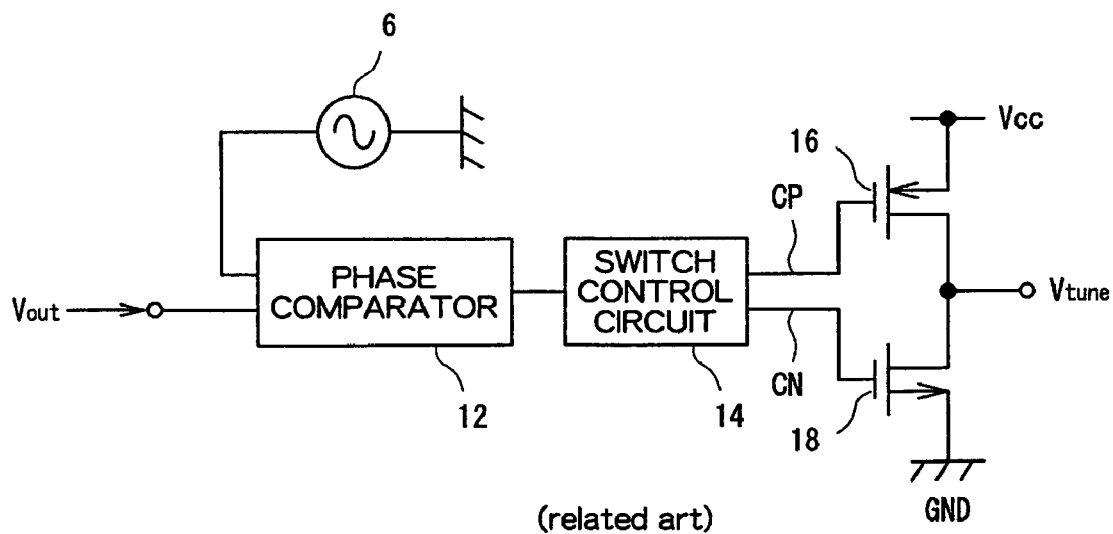
FIG. 2 is a circuit diagram schematically showing a conventional PLL.
Figure 3:
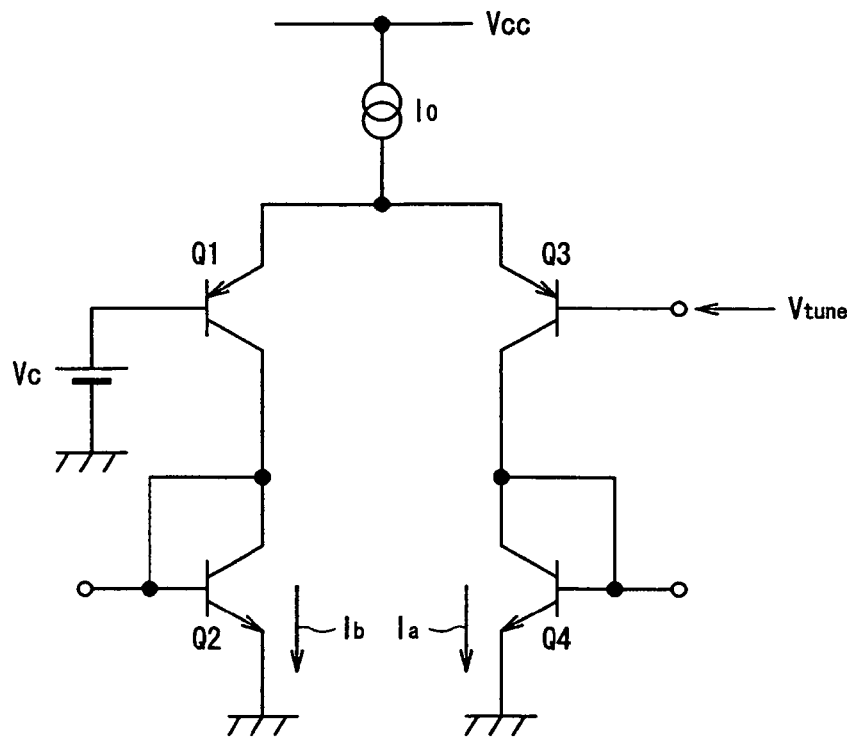
FIG. 3 is a circuit diagram showing a conventional oscillation frequency control circuit.
Figure 4:
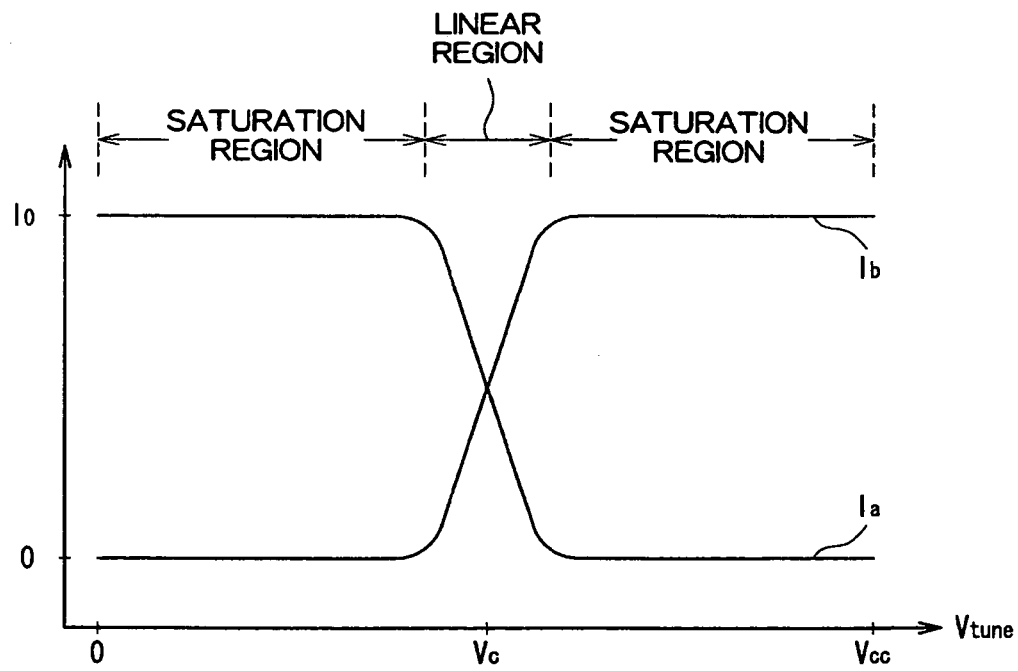
FIG. 4 is a graph showing the variation of currents Ia and Ib of a conventional oscillation frequency control circuit with respect to $V_{tune}$.
Figure 5:
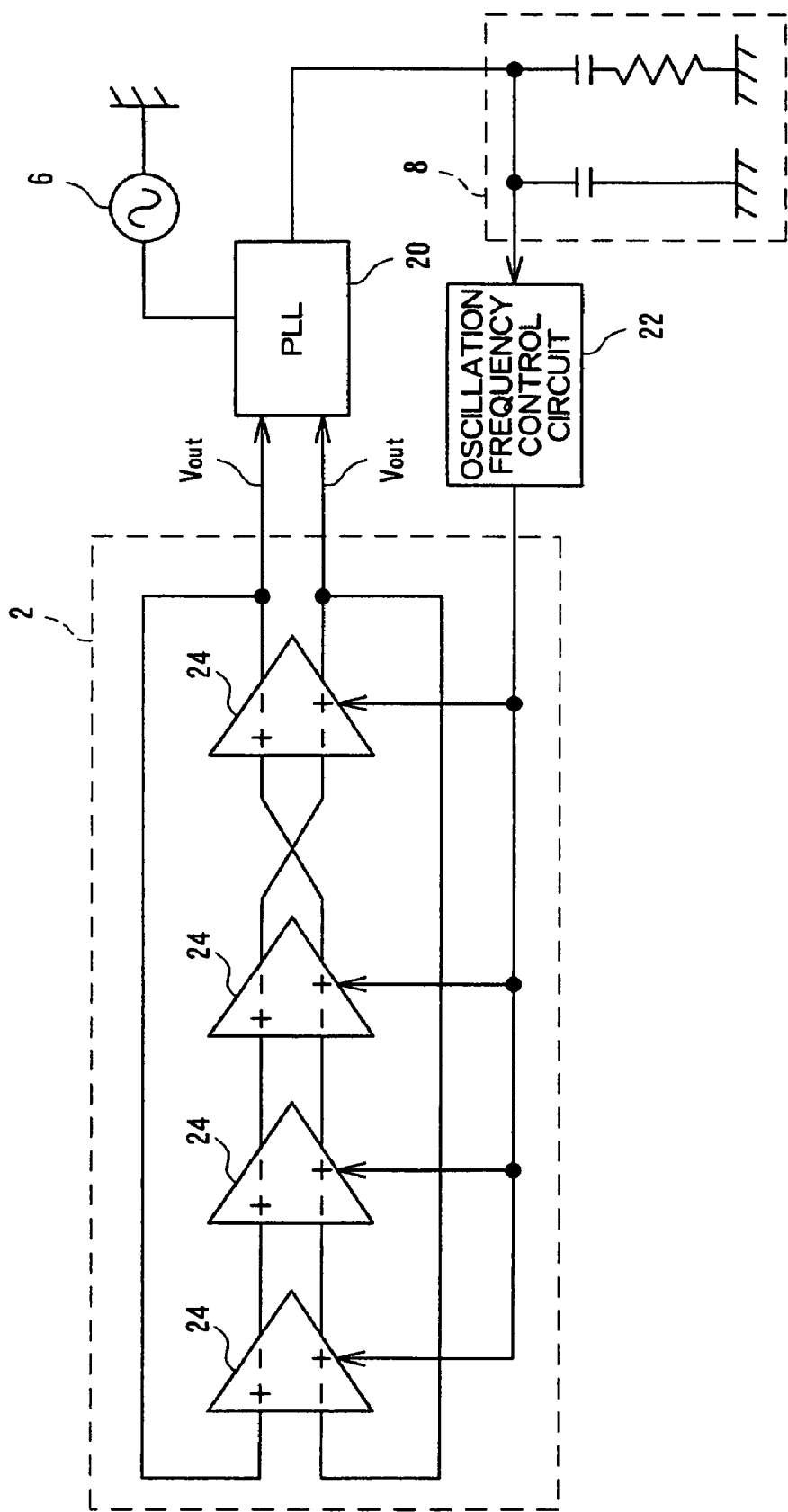
FIG. 5 is a block diagram schematically showing an oscillator according to an embodiment of the invention.

FIG. 5 is a block diagram schematically showing an oscillator according to an embodiment of the invention. This oscillator is constituted by a current-controlled oscillation circuit 2, a PLL 20, a reference signal source 6, a LPF 8 and an oscillation frequency control circuit 22.

The current-controlled oscillation circuit 2 is a differential ring oscillator in which interpolating delay circuits 24 are interconnected, for example, in four-stage. The interpolating delay circuits 24 are differential types. In the embodiment, the ring oscillator is configured in even stage. In this case, in one of the interpolating delay circuits 24 which is interconnected, a differential output of a front stage and a differential input of a next stage are connected not to invert a phase, in the others of the interpolating delay circuits 24, the differential output of the front stage and the differential input of the next stage are connected to invert the phase.

Figure 6:
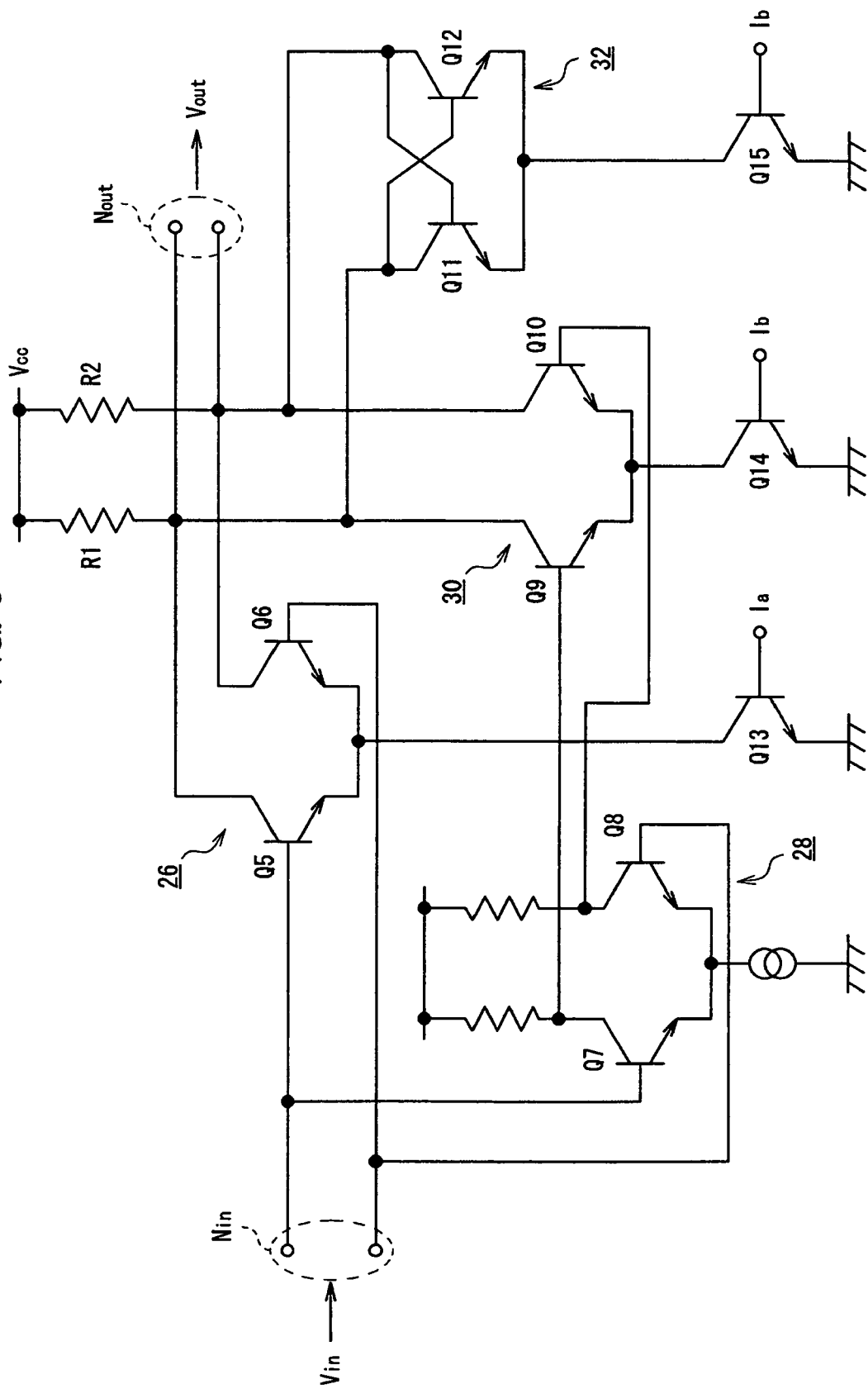
FIG. 6 is a circuit diagram schematically showing an interpolating delay circuit.

FIG. 6 is a circuit diagram schematically showing an interpolating delay circuit 24. The interpolating delay circuit 24 is configured between a power source $V_{cc}$ commonly supplying a predetermined positive voltage to each of the circuits and a ground GND determining a common ground potential to each of the circuits. The interpolating delay circuit 24 has a high-speed path and a low-speed path parallelly configured each other between differential input terminals $N_{in}$ and differential output terminals $N_{out}$.

A differential amplifier circuit 26, which has transistors Q5 and Q6 as a differential pair, is provided in the high-speed path. Further, a differential amplifier circuit 28 which has transistors Q7 and Q8 as a differential pair and a differential amplifier circuit 30 which has transistors Q9 and Q10 as a differential pair are provided in the low-speed path. A gain of the high-speed path and a gain of the low-speed gain are changed by a current of the differential amplifier circuit 26 and a current of differential amplifier circuit 30. The current source of the differential amplifier circuit 26 is constituted by a transistor Q13, and this current source supplies a current Ia. Meanwhile, the current source of the differential amplifier circuit 30 is constituted by a transistor Q14, and this current source supplies a current Ib.

By changing the current Ia, Ib and the gain of each path, it is possible to variably set a delay time of the interpolating delay circuit 24 from a delay time of the high-speed path to a delay time of the low-speed path.

Furthermore, a cross-coupled differential pair 32 constituted by transistors Q11 and Q12 is added to the low-speed path. This cross-coupled differential pair 32 allows the oscillator to realize a larger tuning range. A current source of the cross-coupled differential pair 32 is constituted by a transistor Q15, and this current source supplies a current Ib.

Output currents generated by the differential pair Q5 and Q6 of the high-speed path and output currents generated by the differential pair Q9 and Q10 and the cross-coupled differential pair Q11 and Q12 of the low-speed path are added and synthesized. The added and synthesized currents are converted to a voltage by resistors R1 and R2, and this voltage, which is an output oscillation signal $V_{out}$, is outputted from the output terminals $N_{out}$ of the interpolating delay circuit 24.

The above mentioned currents Ia, Ib supplied to the interpolating delay circuit 24 are controlled by the PLL 20 and oscillation frequency control circuit 22.

The PLL 20 generates and outputs an oscillation frequency control voltage $V_{tune}$ in response to a phase difference between an output oscillation signal $V_{out}$ from the current-controlled oscillation circuit 2 and a reference signal from the reference signal source 6.

Figure 7:
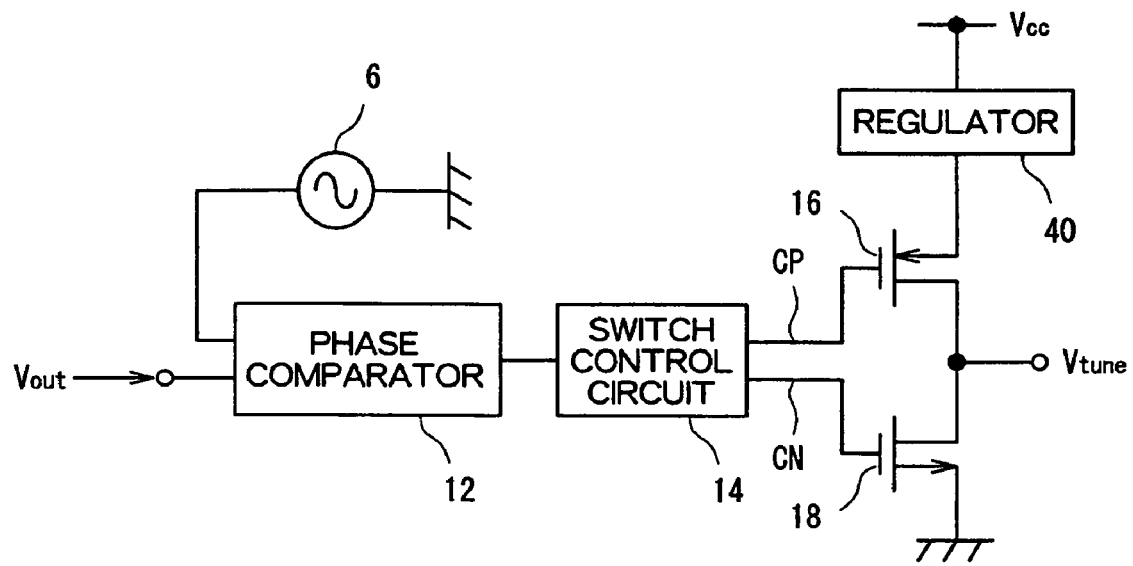
FIG. 7 is a circuit diagram schematically showing a PLL according to an embodiment of the invention.

FIG. 7 is a circuit diagram schematically showing the PLL 20.

The PLL 20 is constituted by a phase comparator 12, a switch control circuit 14, FETs 16, 18 and a regulator 40.

The phase comparator 12 is inputted the output oscillation signal $V_{out}$ and the reference signal S, and detects the phase difference between the signals thereof.

The switch control circuit 14 receives a comparison result signal from the phase comparator 12, and generates a switch control signal which selectively turns on FETs 16, 18.

The regulator 40, which is connected to a power source $V_{cc}$ commonly supplied to each of the circuits, generates and outputs a predetermined voltage $V_r$ smaller than the $V_{cc}$ based on the $V_{cc}$. The FET 16 is connected between an output terminal of this regulator 40 and an output terminal of the $V_{tune}$. The FET 16 is a FET of P channel, and the switch control signal CP is applied to a gate thereof from the switch control circuit 14. Meanwhile, the FET 18 is a FET of N channel connected between a ground potential GND and an output terminal of $V_{tune}$, and the switch control signal CN is applied to a gate thereof from the switch control circuit 14.

For example, in a period in which $V_{out}$ is followed by the reference signal S in phase, CP becomes L level and FET 16 becomes ON state. Accordingly, $V_{tune}$ is increased. Meanwhile, in a period in which $V_{out}$ is preceded by the reference signal S in phase, CN becomes H level and FET 18 becomes ON state. Accordingly, $V_{tune}$ is decreased. Here, since the FET 16 connects a source to the regulator 40, the $V_{tune}$ can be basically changed within a range of an earth potential to $V_r$. In detail, an upper limit voltage $V_u$ of the $V_{tune}$ becomes decreased from the $V_r$ by a terminal voltage in accordance with ON resistance of the FET 16, and a lower limit voltage $V_d$ of the $V_{tune}$ becomes increased from the ground potential by a terminal voltage in accordance with ON resistance of the FET 18. For example, if a channel current is several mA, the terminal voltage is approximately 0.2 V.

If the FET 16 becomes ON state, a capacitor of LPF 8 is charged by a current from the regulator 40, and thereby $V_{out}$ is increased. Meanwhile, if the FET 18 becomes ON state, a capacitor of LPF 8 is discharged through the FET 18, and thereby $V_{out}$ is decreased.

Figure 8:
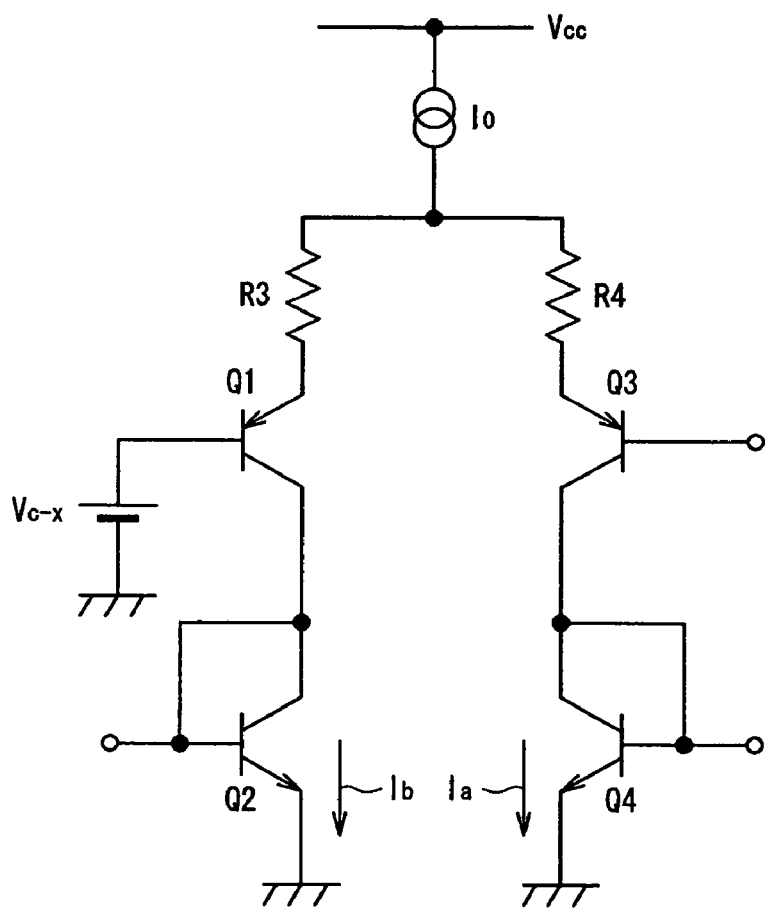
FIG. 8 is a circuit diagram schematically showing an oscillation frequency control circuit according to an embodiment of the invention.

FIG. 8 is a circuit diagram schematically showing an oscillation frequency control circuit 22. The oscillation frequency control circuit 22 is a differential amplifier circuit, and a current path consisting of channels of transistors Q1 and Q2 which are interconnected serially and a current path consisting of channels of transistors Q3 and Q4 which are interconnected serially are connected to a common constant current source I0.

This oscillation frequency control circuit 22 is different from a conventional oscillation frequency control circuit 10 in that resistors R3, R4 are connected to each of the current paths, respectively, to enlarge a voltage range of a linear region in operation thereof. Here, the resistor R3 is connected between an emitter of Q1 and $V_{cc}$, and the resistor R4 is connected between an emitter of Q2 and $V_{cc}$.

Further, a base of Q1 is connected to a reference voltage $V_{c-x}$ and $V_{tune}$ is applied to a base of Q3. Here, the $V_{c-x}$, which is different from $V_c$ of the conventional oscillation frequency control circuit 10, is set to a voltage shifted by a predetermined voltage than $V_{cc}/2$ which is intermediate voltage between $V_{cc}$ and GND. Here, the $V_{c-x}$ is shifted toward GND corresponding to lowering of an upper limit voltage $V_u$ of the $V_{tune}$ by the regulator 40.

Figure 9:
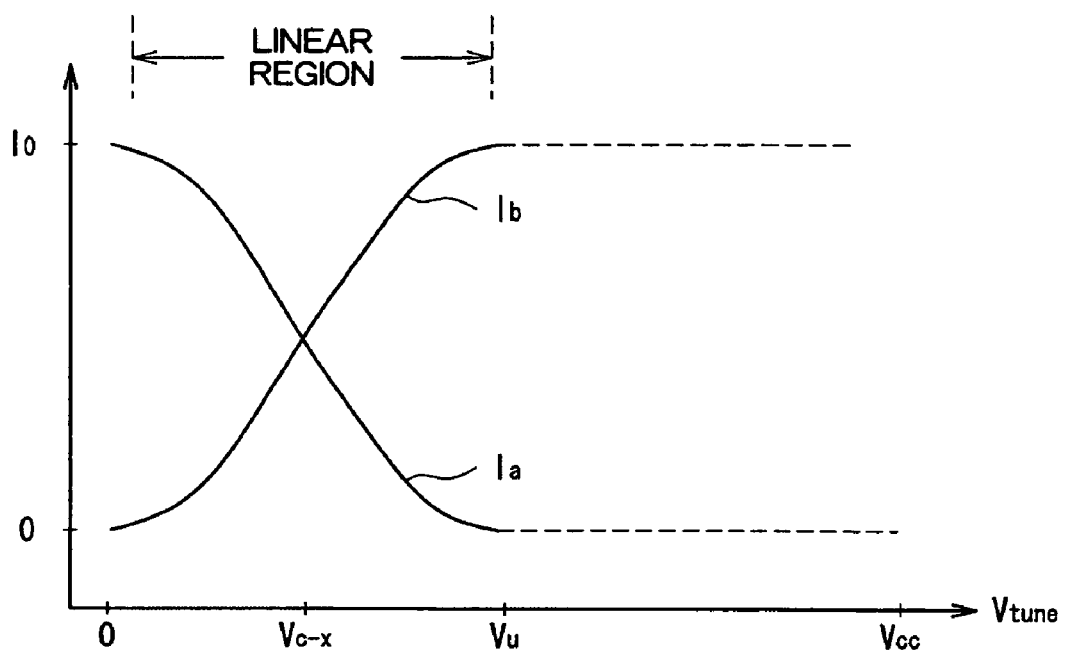
FIG. 9 is a graph showing the variation of the Ia and Ib with respect to $V_{tune}$ of an oscillation frequency control circuit.

FIG. 9 is a graph showing the variation of the Ia flowing through transistor Q4 and Ib flowing through transistor Q2 of an oscillation frequency control circuit 22 with respect to $V_{tune}$. As described above, the width of a linear region is enlarged by resistors R4, R3 inserted to current paths of currents Ia, Ib in the oscillation frequency control circuit 22.

This $V_{tune}$ width is a range in which deadlock does not occur and an oscillation frequency control circuit 22 can control an oscillation frequency. That is, the $V_{tune}$ width is an input dynamic range of the oscillation frequency control circuit 22. For example, although a conventional input dynamic range is approximately $V_c \pm 0.1V$, in the present oscillator, it is enlarged up to $V_{c-x} \pm 1.0V$.

Further, corresponding to setting this input dynamic range, the $V_{c-x}$ is set to, for example, 1.2V, and thereby a lower limit voltage of the linear region can be matched to a lower limit voltage $V_d$ (for example, approximately 0.2V) of the $V_{tune}$.

Further, as described above, in the PLL 20, although the upper limit voltage $V_u$ of the $V_{tune}$ is limited by the regulator 40, for example, the $V_u$ (for example, approximately $V_r - 0.2V$) can be matched to an upper limit voltage of the linear region by setting an output voltage $V_r$ of the regulator 40 to approximately 2.6V.

Accordingly, by enlarging an input dynamic range and decreasing a gain (that is, inclination of Ia, Ib) of oscillation frequency to $V_{tune}$, it is possible to improve a phase noise characteristic of the PLL 20. Further, by the shift of reference voltage $V_{c-x}$ and limiting the variation width of $V_{tune}$ by the regulator 40, it is possible to avoid the use of a saturation region of the oscillation frequency control circuit 22 and to prevent the deadlock of an oscillation frequency control.

Accordingly, the oscillation frequency control circuit 22 operates in a linear region of Ia, Ib characteristic, and thus generates a current Ib through Q2 and a current Ia through Q4 in response to $V_{tune}$ generated by PLL 20. A base of Q2 is connected to bases of Q14 and Q15 of each interpolating delay circuit 24, and Q2, and Q14 and Q15 constitute a current mirror circuit. Accordingly, currents through Q14 and Q15 become equal to a current Ib through Q2, and variably controlled in accordance with $V_{tune}$ by the oscillation frequency control circuit 22. Similarly, a base of Q4 is connected to a base of Q13 of each interpolating delay circuit 24, and Q4 and Q13 constitute a current mirror circuit. Accordingly, a current through Q13 become equal to a current Ia through Q4, and variably controlled in response to $V_{tune}$ by the oscillation frequency control circuit 22.

Here, as described before, the oscillation frequency control circuit 22 is a differential amplifier circuit, and the sum of Ia and Ib is fixed to a constant value I0. Accordingly, the increase and decrease of Ia and Ib in accordance with $V_{tune}$ is complementary, and, in the configuration described above, if the $V_{tune}$ is decreased, the Ia is increased and the Ib is decreased, and thereby a delay time is decreased in the interpolating delay circuit 24. Meanwhile, if the $V_{tune}$ is increased, the Ia is decreased and the Ib is increased, and thereby the delay time is increased. As a result, a frequency of an output oscillation signal $V_{out}$ of the current-controlled oscillation circuit 2 is variably controlled. Additionally, since the sum of Ia and Ib is fixed to a constant value I0, it is possible to constantly fix an output amplitude of the interpolating delay circuit 24.

Moreover, in the configuration described above, although the upper limit voltage $V_u$ of the $V_{tune}$ is controlled by the regulator 40, a regulator may be provided between GND and FET 18 to thereby increase a lower limit voltage $V_d$ of the $V_{tune}$. In this case, $V_{c-x}$ is set to a value shifted more than $V_{cc}/2$. For example, from the viewpoint of deadlock prevention, it is preferable to set an upper limit voltage of the linear region to a value corresponding to $V_u$. Also, from the viewpoint of the same deadlock prevention, it is preferable to set an output voltage of a regulator, so that $V_d$ is a value corresponding to a lower limit voltage of the linear region.

An oscillator according to the invention includes: a differential amplifier circuit that is applied an oscillation frequency control voltage and a reference voltage to a pair of input terminals provided corresponding to two current paths connected to the common current source and takes out a pair of current as a differential output current from a current flowing through each of the current paths, and controls an oscillation frequency of the output oscillation signal based on the differential output current, wherein the differential amplifier circuit have resistor elements serially connected to each of the current paths. In the configuration described above, an oscillation frequency control circuit 22 is the differential amplifier circuit, and resistors R3, R4 are serially connected to each of the two current paths.

In the oscillator described above, resistance values of the resistor elements can be set such that a linear region of the differential output current with respect to the variation of the oscillation frequency control voltage includes a target control range of the oscillation frequency control voltage. In the configuration described above, as shown in FIG. 9, by the resistors R3, R4, the width of a linear region of the differential output currents Ia, Ib is enlarged, thus becomes a target control range of the oscillation frequency control voltage $V_{tune}$, and is adjusted to include a desired voltage range not generating a deadlock.

Resistance values of the resistor elements can be set in response to an allowable fluctuation range of the oscillation frequency with respect to a noise voltage included in the oscillation frequency control voltage. In the configuration described above, the width of a linear region is enlarged by the resistors R3, R4, and thereby the gain of the oscillation frequency with respect to $V_{tune}$ is decreased. Accordingly, it is possible to cope with the case that the allowable fluctuation range of the oscillation frequency with respect to a noise voltage is small, and to obtain the improvement of the phase noise characteristic of the PLL 20.

An oscillator according to the invention includes: a PLL 20 that generates an oscillation frequency control voltage $V_{tune}$ based on a phase difference between an output oscillation signal $V_{out}$ and a reference signal from a reference signal source 6; and an oscillation frequency control circuit 22, which is a differential amplifier circuit, that is applied the oscillation frequency control voltage $V_{tune}$ and the reference voltage $V_{c-x}$ to a pair of input terminals provided corresponding to two current paths connected to a common current source and takes out a pair of currents Ia, Ib flowing through each of the current paths as a differential output current, and controls an oscillation frequency of the output oscillation signal based on the differential output current Ia, Ib. The PLL 20 includes a phase comparator 12 that detects the phase difference; a first switch element 16 that is connected between a output terminal of the oscillation frequency control voltage and a first common power source; a second switch element 18 that is connected between the output terminal and a second common power source; a regulator 40 that is provided between the first common power source and the first switch element, and thereby generates a predetermined limit voltage based on the first common power source; and a switch control circuit 14 that allows the first switch element and the second switch element to selectively become ON state in response to the phase difference. The limit voltage is set in response to a voltage near the first common power source out of upper limit voltage and lower limit voltage of a linear region of the differential output current with respect to the variation of the oscillation frequency control voltage. In the described above configuration of the oscillator in which the first common power source is a power source $V_{cc}$ of a positive voltage, and the second common power source is an earth, the limit voltage is set in response to an upper limit voltage of the linear region. Additionally, for example, in the configuration in which the first common power source is an earth, and the second common power source is $V_{cc}$, the limit voltage is set in response to a lower limit voltage of the linear region.

The oscillator according to the invention, as described above, has a configuration which sets the limit voltage in response to an upper limit voltage or a lower limit voltage of the linear region, further, the differential amplifier circuit can include resistor elements serially connected to each of the current paths. Resistance values of these resistor elements, as described before, can be set to allow a linear region of the differential output current to include a target control range of the oscillation frequency control voltage.

In the configuration of the oscillator in which the limit voltage is set in response to an upper limit voltage or a lower limit voltage of the linear region, the reference voltage can be set to allow a voltage near the second common power source out of upper limit voltage and lower limit voltage of the linear region to be a voltage in response to the second common power source. In the described above configuration of the embodiment in which an upper limit voltage $V_u$ of the $V_{tune}$ is lowly suppressed by the regulator 40, corresponding to setting the input dynamic range of the oscillation frequency control circuit 22, the $V_{c-x}$ is set to a voltage shifted toward GND which is the second common power source and thereby a lower limit voltage of the linear region can be matched to a lower limit voltage $V_d$ (for example, approximately 0.2V) of the $V_{tune}$.

The second common power source, as described above, can be an earth.

Further, the oscillator of the invention includes a ring oscillator having interpolating delay circuits interconnected in multi-stage in which the transfer time of a signal from an input terminal to an output terminal is variably controlled in response to the differential output current, and the ring oscillator can generate the output oscillation signal.

According to the present invention, the voltage range of a linear region of the differential output currents is enlarged by the resistors serially connected to each of the current paths of the differential amplifier circuit. Accordingly, the change of an oscillation frequency with respect to the variation of an oscillation frequency control voltage in the linear region becomes moderate and thereby a phase noise characteristic is improved. Further, by enlarging the width of the linear region and limiting the variation range of the oscillation frequency control voltage by the regulator or the shift of reference voltage, it is difficult for the oscillation frequency control voltage to enter a saturation region, and thus it is possible to avoid a deadlock state.

What is claimed is:

1. An oscillator comprising:
    a phase-locked loop circuit that generates an oscillation frequency control voltage based on a phase difference between an output oscillation signal and a reference signal; and
    a differential amplifier circuit that is applied the oscillation frequency control voltage and the reference voltage to a pair of input terminals provided corresponding to two current paths connected to a common current source and takes out a pair of currents flowing through each of the current paths as a differential output current, the oscillator controlling an oscillation frequency of the output oscillation signal based on the differential output current, wherein the phase-locked loop circuit comprises a phase comparator that detects the phase difference;

a first switch element that is connected between a output terminal of the oscillation frequency control voltage and a first common power source;

a second switch element that is connected between the output terminal and a second common power source;

a regulator that is provided between the first common power source and the first switch element, and thereby generates a predetermined limit voltage based on the first common power source; and a switch control circuit that allows the first switch element and the second switch element to selectively become ON state in response to the phase difference, and wherein the limit voltage is set in response to a voltage near the first common power source out of upper limit voltage and lower limit voltage of a linear region of the differential output current with respect to the variation of the oscillation frequency control voltage.

2. The oscillator according to claim 1, wherein the differential amplifier circuit comprises resistor elements serially connected to each of the current paths, and wherein resistance values of the resistor elements are set to allow the linear region to include a target control range of the oscillation frequency control voltage.

3. The oscillator according to claim 1, wherein the reference voltage is set to allow a voltage near the second common power source out of upper limit voltage and lower limit voltage of the linear region to be a voltage in response to the second common power source.

4. The oscillator according to claim 1, wherein the second common power source is an earth.

5. The oscillator according to claim 1, further comprising a ring oscillator having interpolating delay circuits interconnected in multi-stage in which the transfer time of a signal from an input terminal to an output terminal is variably controlled in response to the differential output current, wherein the ring oscillator generates the output oscillation signal.

* * * * *